United States Patent
Huang et al.

(10) Patent No.: US 6,344,687 B1
(45) Date of Patent: Feb. 5, 2002

(54) DUAL-CHIP PACKAGING

(76) Inventors: Chih-Kung Huang; Shu-hua Tseng, both of 6-20, Ta-Po Rd., Chiao-Pai Li, Yi-Lan (TW)

( * ) Notice: Subject to any disclaimer, the term of this patent is extended or adjusted under 35 U.S.C. 154(b) by 0 days.

(21) Appl. No.: 09/470,188

(22) Filed: Dec. 22, 1999

(51) Int. Cl.[7] .............................................. H01L 23/34
(52) U.S. Cl. ........................ 257/724; 257/735; 257/780
(58) Field of Search ................................ 257/724, 735, 257/737, 738, 780, 782, 784, 787, 676

(56) References Cited

U.S. PATENT DOCUMENTS

| | | | |
|---|---|---|---|
| 5,545,922 A | * 8/1996 | Golwalkar et al. | 257/676 |
| 5,596,225 A | * 1/1997 | Mathew et al. | 257/667 |
| 5,818,102 A | * 10/1998 | Rostoker | 257/666 |
| 5,889,325 A | * 3/1999 | Uchida et al. | 257/724 |
| 5,905,639 A | * 5/1999 | Warren | 361/776 |
| 6,153,928 A | * 11/2000 | Cho | 257/686 |

* cited by examiner

Primary Examiner—Karl D. Easthom
Assistant Examiner—Kyung S. Lee
(74) Attorney, Agent, or Firm—J. C. Patents

(57) ABSTRACT

A dual-chip packaging structure comprises a die pad with a chip attached to each of its two surfaces. Outside and around the die pad is a plurality of first metal studs. A plurality of second metal studs is arranged outside and around the first metal studs. Connections between the first metal studs and the second metal studs are made by means of a plurality of conductive traces. The two chips on the respective surfaces of the die pad are connected to corresponding ends of the first metal studs through bonding wires. An insulating material is employed to enclose the two chips, the die pad, the first metal studs, the conductive traces, and ends of the second metal studs, with other ends of the second metal studs exposed. A plurality of solder balls is attached to the respective exposed ends of the second metal studs.

21 Claims, 3 Drawing Sheets

DUAL-CHIP PACKAGING

BACKGROUND OF THE INVENTION

1. Field of Invention

The present invention relates to a manufacturing process and structure of a dualchip package. More particularly, the present invention relates to a dual-chip package in which metal studs and solder balls are employed as connection media to external circuitry.

2. Description of Related Art

High performance, high level of integration, low cost, increased miniaturization of components and devices are all the common goals in the semiconductor design and manufacture. Mass production of 0.18 microns semiconductor devices are currently achieved and its integration level need not be emphasized. However, higher carrier density, smaller in overall volume, etc. are still main concerns for having high integration level of electronic packaging. Indeed, no matter whether on computers or general commodities, in order to reduce the overall size and the cost, a technique of putting two or more individual chips in a single package has been developed. This kind of packaging will be mainstream in the future. Multichip packaging can be employed to integrate processors and memory chips, or Logic chips and memory chips (including DRAMs, Flash memories, etc.) in a single package. Thus, the cost and the overall size are reduced. Moreover, signal transmission distances can be shortened, and hence, the performance is enhanced. In addition, different individual chips with different fabrication processes can be put together in a single package and no special integration manufacturing processes is required.

Reference is made to FIG. 1, which illustrates a prior art dual-chip packaging structure. This kind of structure has been disclosed in Japanese Laid-Open Utility Model Application No. 147360/1978 (Jitsukaisho 62-147360). Two chips 100, 102 are attached to two surfaces of a die pad 104, respectively, and connected to conductive leads 106 through bonding wires 108. An encapsulant is employed to enclose the two chips 100 and 102, inner portions of the conductive leads 106, and the bonding wires 108. However, a conventional leadframe is employed as a carrier in this dual-chip packaging structure, so the level of integration is limited and signal paths are relatively longer. Moreover, after a first chip is attached on the die pad and wire bonding is completed, a special clamping apparatus is required for attaching a second chip on the die pad and wire bonding operation. Thus, both the cost and the manufacturing complexity are increased.

SUMMARY OF THE INVENTION

Accordingly, an object of the present invention is to provide a dual-chip packaging structure having a relatively high level of integration and short signal paths Another object of the present invention is to provide a dual-chip packaging structure having a relatively small overall packaging volume.

Yet another object of the present invention is to provide a dual-chip packaging structure having simple manufacturing process and low cost of production.

To achieve these objects and other advantages and in accordance with the present invention, a dual-chip packaging structure is described herein, which comprises a die pad, to each of whose two surfaces is respectively attached a chip. Outside and around the die pad is a plurality of first metal studs. A plurality of second metal studs is arranged outside and around the first metal studs. Connections between the first metal studs and the second metal studs are made by means of a plurality of conductive traces. The two chips on respective surfaces of the die pad are connected to corresponding ends of the first metal studs through bonding wires. An insulating material is employed to enclose the two chips, the die pad, the first metal studs, the conductive traces, and ends of the second metal studs, with other ends of the second metal studs exposed. A plurality of solder balls is attached to the respective exposed ends of the second metal studs.

To achieve these objects and other advantages and in accordance with the present invention, a manufacturing process for a dual-chip packaging structure is described herein, which comprises a conductive substrate having a first surface, a second surface, and a die pad region. Outside and around the die pad region is a plurality of first metal stud regions. A plurality of second metal stud regions is arranged outside and around the first metal stud regions. Connections between the first metal stud regions and the second metal stud regions are made by means of a plurality of conductive trace regions. A mask layer is formed which covers the second surface, the die pad of the first surface, the first metal stud regions, the second metal stud regions, and the conductive trace regions. The first surface is then half etched such that the uncovered portions of the first surface are removed and a predetermined thickness is obtained. A first chip is attached on the die pad region of the first surface. Connections between the first chip and the first metal stud regions are made by bonding wires. A first insulating layer is formed which covers the first surface. The second surface is etched until the first insulating layer is exposed. In this instance, a die pad, first metal studs, second metal studs, and conductive traces are formed at the corresponding regions. A second chip is attached to the die pad of the second surface. Connections between the second chip and the first metal studs are made by the conductive traces. A second insulating layer is formed which covers the second surface with portions of the second metal studs of the second surface exposed. A plurality of solder balls is attached to the exposed portions of the second metal studs of the second surface.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
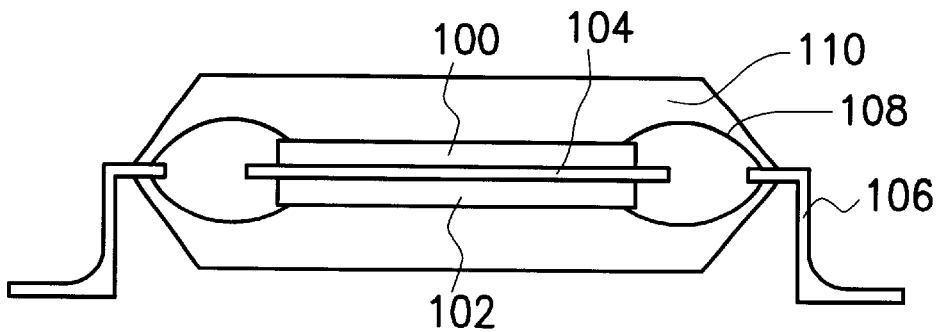
FIG. 1 is a schematic view of a prior art dual-chip packaging structure.
Figure 2:
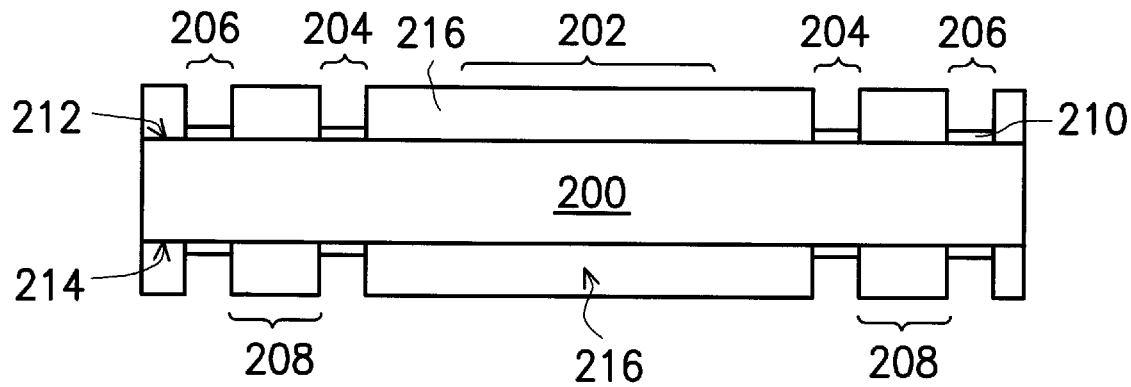
FIGS. 2 to FIG. 7 are cross-sectional views of the manufacturing process of a dual-chip package in accordance with a preferred embodiment of the present invention.

Reference is made to FIGS. 2 to 7, which show schematic, cross-sectional views of the manufacturing process of a dual-chip packaging structure in accordance with a preferred embodiment of the present invention. As shown in FIG. 2, a conductive substrate 200 is provided. It is typically constructed from a material including copper, iron, copper alloy (C151, C194, C7025, KCF125, EFTEC, etc.) Ni—Fe 42 alloy or other similar matter. The whole conductive substrate 200 at least includes the following regions, that is, a die pad region 202, first metal stud regions 204, second metal stud regions 206, and conductive trace regions 208. The die pad region 202 is reserved for the fabrication of a die pad. The first metal stud regions 204 are arranged outside and around the die pad region 202, which are reserved for the fabrication of first metal studs. The first metal studs are employed for connections to bonding pads of a die. The second metal stud regions 206 are arranged outside and around the first metal stud regions 204, which are reserved for the fabrication of second metal studs. The second metal studs are employed for connections to solder balls. The conductive trace regions 208 are reserved for the fabrication of conductive traces. The conductive traces are employed for connections between the corresponding first metal studs and the corresponding second metal studs. A plated layer 210 can be formed on the first metal stud regions 204 and the second metal stud regions 206 to improve the bondability and solderability during a later manufacturing process. For example, a photoresist layer 216 can be first formed on two surfaces 212, 214 of the conductive substrate 200. Then, by means of lithography technique, the first metal stud regions 204 and the second metal stud regions 206 are exposed. The plated layer 210 is then formed by either an electroplating or electrolessplating method. The material of the plated layer 210 includes Nickel, Palladium, Ni—Pd alloy, gold, silver and so on.

Figure 3:
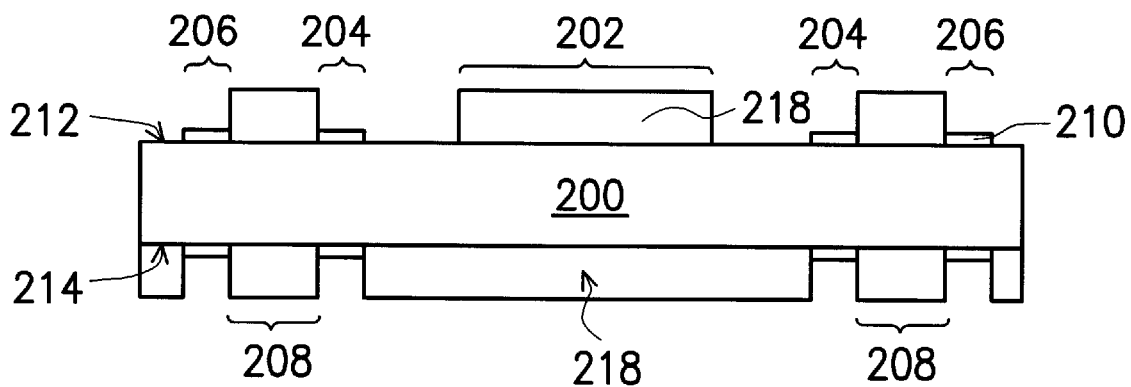

Reference is made to FIG. 3 in which the photoresist layer 216 shown in FIG. 2 has been removed. A photolithography process is again performed to fabricate a photoresist layer 218. At this episode, the surface 214 is completely covered by the photoresist layer 218, except in the first metal stud regions 204 and the second metal stud regions 206, which are protected by the plated layer 210. On the surface 212, the photoresist layer 218 at least covers the die pad region 202 and the conductive trace regions 208.

Figure 4:
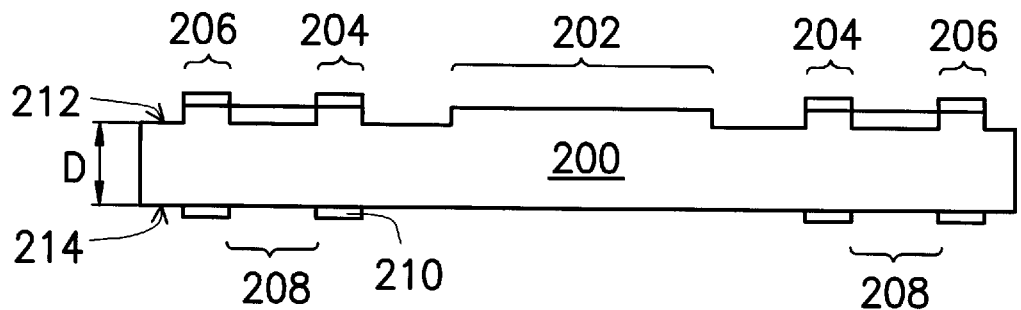

Reference is made to FIG. 4, in which a half etching operation is performed while employing the photoresist layer 218 and the plated layer 210 shown in FIG. 3 as a mask layer. The exposed regions of the surface 212 are etched to a predetermined thickness D. The photoresist layer (item 218 in FIG. 3) is then removed. In this instance, shapes of the die pad, the first metal studs, the second metal studs, and the conductive traces can almost be identified.

Figure 5:
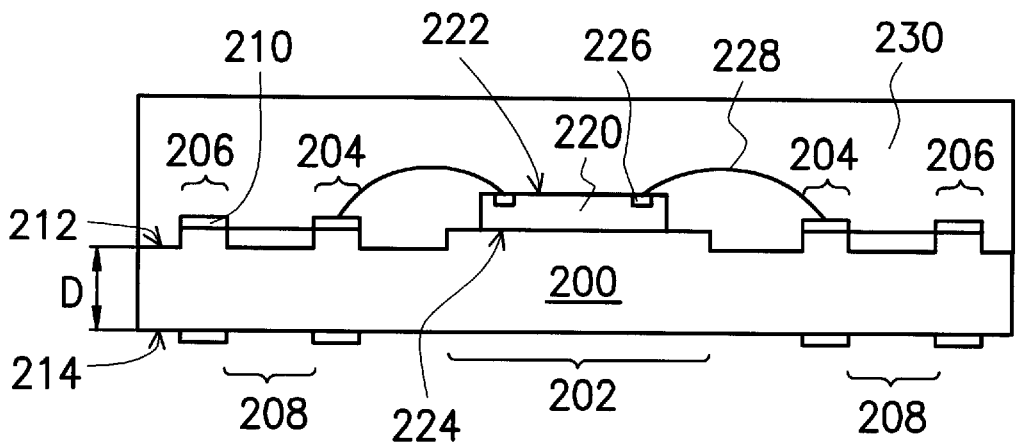

Reference is made to FIG. 5, in which a first episode of die attachment and wire bonding processes is performed. A chip 220 is attached to the die pad region 202 of the surface 212. The chip 220 includes an active surface 222 and a back surface 224. The back surface 224 is adhered to the die pad region 202 of the surface 212 by means of, for example, conductive paste or insulating paste (not shown). The active surface 222 contains bonding pads 226. Wire bonding process is performed in which connections between the bonding pads 226 and the first metal stud regions 204 of the surface 212 are made by means of bonding wires 228. The bonding wires 228 are made of materials including gold, aluminum, and copper. A first episode of encapsulation is then performed in which the chip 220, the first metal stud regions 204, the second metal stud regions 206, the conductive trace regions 208, the bonding wires 228, etc. of the surface 212 are all enveloped by an insulating material 230. The insulating material 230 includes a resin, an epoxy, a liquid compound. and so on. Its formation includes a coating and curing process.

Figure 6:
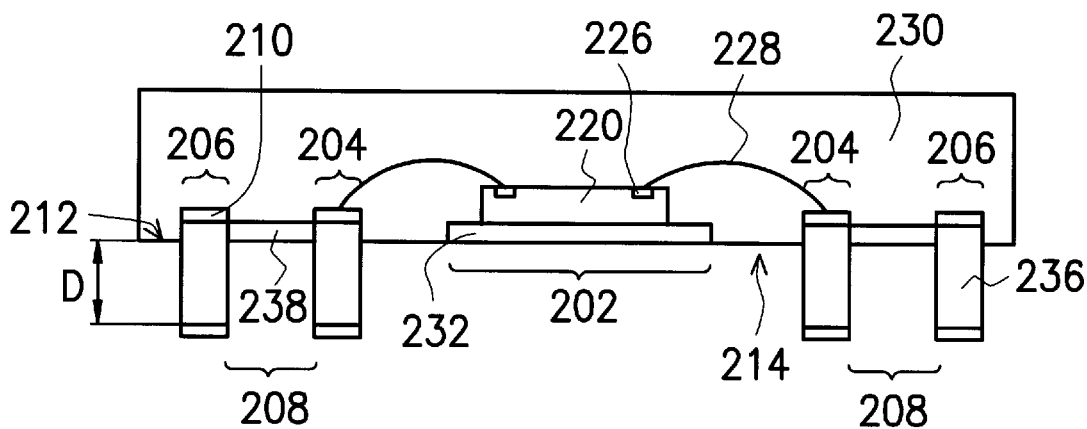

Reference is made to FIG. 6, in which the surface 214 of the conductive substrate 200 is etched. While the surface 212 is protected by the insulating material 230, and the first metal stud regions 204 and the second metal stud regions 206 of the surface 214 are protected by the plated layer 210, other exposed portions of the surface 214 are etched until the insulating material 230 is exposed. That is, the predetermined thickness D is further removed. In this instance, the die pad 232 is formed in the die pad region 202, the first metal studs 234 are formed in the first metal stud regions 204, the second metal studs 236 are formed in the second metal stud regions 206, and the conductive traces 238 are formed in the conductive trace regions 208.

Figure 7:
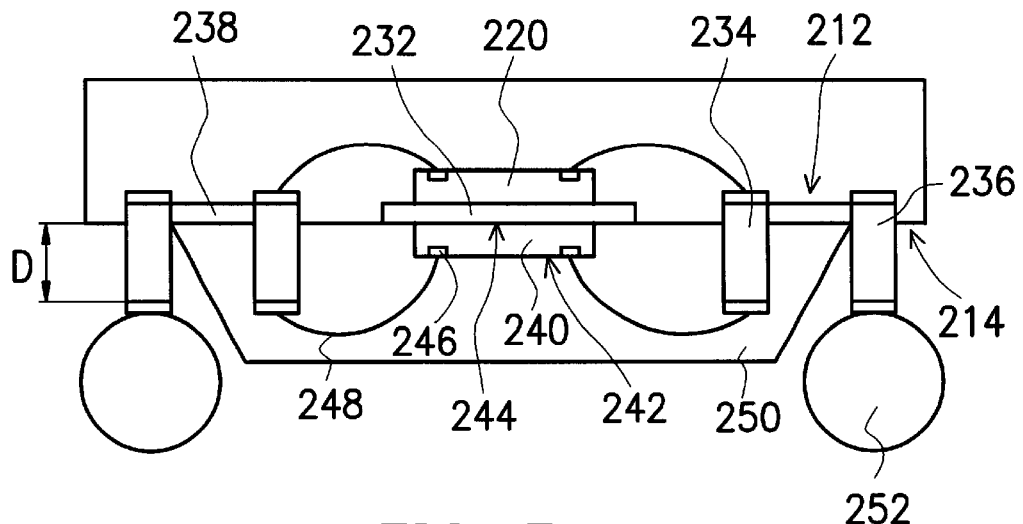

Reference is made to FIG. 7, in which a second episode of die attachment and wire bonding processes is performed. A chip 240 is attached to the die pad 232 of the surface 214. The chip 240 includes an active surface 242 and a back surface 244. The back surface 244 is adhered to the die pad 232 of the surface 214 by means of, for example, conductive paste or insulating paste (not shown). The active surface 242 contains bonding pads 246. A wire bonding process is performed in which connections between the bonding pads 246 and the first metal studs 234 of the surface 214 are made by means of bonding wires 248. The bonding wires 248 are made of materials including gold, aluminum, and copper. A second episode of encapsulation is then performed in which the chip 240, the first metal studs 234, the conductive traces 238, the bonding wires 248, etc. of the surface 214 are all enveloped by an insulating material 250, with the exception of the second metal studs 26 of the surface 214. The insulating material 250 includes a resin. an epoxy, a liquid compound, etc. Its formation includes a screen printing and curing or a molding process. Attachment of solder balls is performed in which solder balls 252 are placed on the respective exposed second metal studs 236. The solder balls 252 serve as contact points of the package to external circuitry. Materials of the solder balls 252 include tin-lead alloy. For mass production employing the manufacturing process described above, a plurality of dual-chip packages can be fabricated first on a conductive substrate simultaneously, and a trimming operation is then followed.

Figure 8:
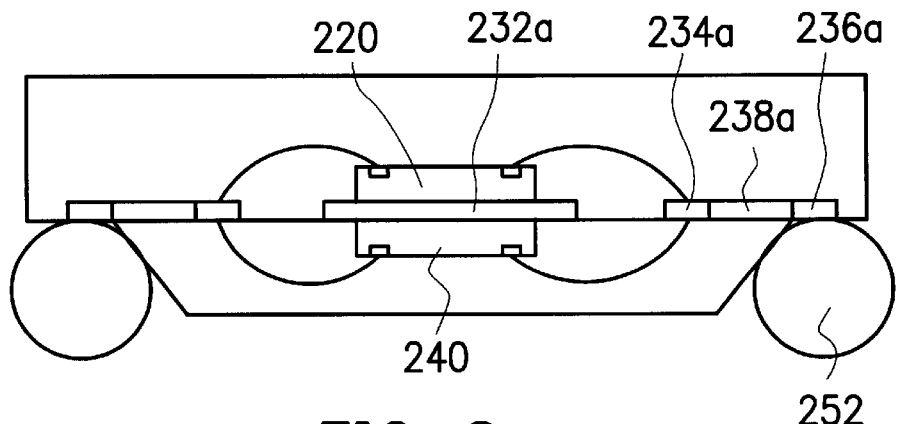
FIG. 8 is a cross-sectional view of a dual-chip packaging structure without using a plated layer in accordance with the present invention.

Alternately, another manufacturing process according to the present invention is available. For example, the plated layer 210 described above can be replaced by a photoresist layer and then serves as a mask layer. Thereby, the final thickness of metal studs is thinner as shown in FIG. 8. Reference is now made to FIG. 8, which illustrates a dual-chip package fabricated without using plated layers. Ends of first metal stud 234a and second metal stud 236a are not covered by plated layers. The final thickness of them is the same as the conductive traces 238a. Remaining manufacturing steps are similar to those described above.

In the dual-chip packaging structure according to the present invention, two chips are attached to two surfaces of a die pad, respectively. Bonding pads of the two chips are connected to corresponding ends of first metal studs by bonding wires. The two surfaces are enclosed by insulating materials which covered the two chips, the first metal studs the bonding wires, conductive traces, and one end of each second metal stud. The other end of each second metal stud is exposed, on which end a solder ball is attached.

Figure 9:
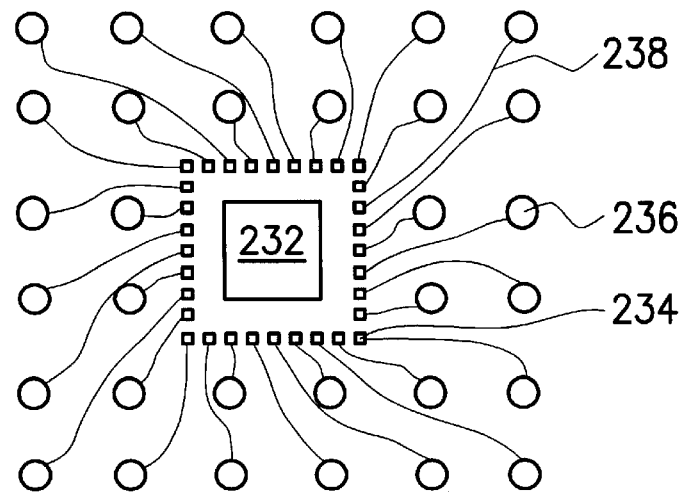
FIG. 9 is a schematic view showing metal studs layout of a dual-chip packaging structure in accordance with the present invention

Further description of the manufacturing process according to the present invention is given as follows. The arrangement of the second metal studs described above are in peripheral layout. However, in order to increase the level of integration and adapted to high lead-count devices, an area array arrangement can be employed for the second metal studs as shown in FIG. 9, where the layout of metal studs in a dual-chip package is schematically illustrated. Therein, a die pad 232 is located in the center for chip attachment. First metal studs 234 are located outside the die pad and surrounding it, and are connected to bonding pads on the chip. Second metal studs 236 are located outside the first metal studs in an area array arrangement and attached with solder balls. Conductive traces 238 are respectively connected to the corresponding first metal studs 234 and the corresponding second metal studs 236.

Based on the foregoing, the dual-chip packaging structure and manufacturing process in accordance with the present invention at least includes the following advantages.

1. In the dual-chip packaging structure in accordance with the present invention, two individual chips are integrated in a single package. Because an area array configuration can be employed herein, the level of integration is relatively higher. Metal studs, conductive traces, and solder balls are used as connection media to external circuitry, and hence, signal paths are relatively short and the performance of the package can be enhanced.

2. In the dual-chip packaging structure in accordance with the present invention, an etching technique is employed for fabrications of metal studs and conductive traces. Pitch is then relatively small, and hence, an overall volume of the package can be reduced.

3. In the dual-chip packaging structure in accordance with the present invention, integration of carrier formation process (including formations of a die pad, metal studs, and conductive traces) and assembly process (including die attachment, wire bonding, encapsulating, etc.) is established. T hereby, the manufacturing process is simplified and the production cost is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dual-chip package, comprising:
a die pad;
a plurality of first metal studs located around the die pad;
a plurality of second metal studs around the first metal studs;
a plurality of conductive traces electrically connecting the first metal studs and the second metal studs;
a first chip attached to a top surface of the die pad and electrically connected to respective top ends of the first metal studs;
a second chip attached to a bottom surface of the die pad and electrically connected to respective bottom ends of the first metal studs; and
an insulating material sealing the first chip, the second chip, the connection between the first chip and the first metal studs, the connection between the second chip and the first metal studs, and the conductive traces, wherein the first studs are entirely enclosed, leaving only one end of each second stud exposed for external connection.

2. The dual-chip package of claim 1, wherein the two ends of the first metal studs include plated layers.

3. The dual-chip package of claim 1, wherein the other ends of the second metal studs includes plated layers.

4. The dual-chip package of claim 1, wherein the electrical connections between the first bonding pads and the ends of the first metal studs are established by bonding wires.

5. The dual-chip package of claim 1, wherein the electrical connections between the second bonding pads and the other ends of the first metal studs are established by bonding wires.

6. The package of claim 1, wherein the first and second metal studs are thicker than the conductive traces.

7. The Package of claim 1, wherein the first and second metal studs have substantially the same thickness as the conductive traces.

8. The package of claim 1, further comprising a plurality of solder balls respectively located on the exposed ends of the second metal studs.

9. A method of manufacturing a dual-chip package, comprising the steps of:
providing a conductive substrate;
defining a die pad region, a first metal stud region and a second metal stud region on a top surface of the substrate, wherein the first metal stud region is located around the die pad region, and the second metal stud region is spaced from and around the first stud region;
attaching a first chip onto the die pad region and electrically connecting the first chip to the first metal stud regions;
forming a first insulating layer over the top surface of the conductive substrate, the first chip, and the connections between the first chip and the first metal stud regions;
removing a bottom surface of the conductive substrate until the first insulating layer is exposed, such that a die pad having a bottom surface is formed in the die pad region, a plurality of first metal studs are formed in the first metal stud region, a plurality of second metal studs arc formed in the second metal stud region, and a plurality of conductive traces are formed between the first metal studs and the second metal studs;
attaching the second chip to the bottom surface of the die pad and electrically connecting the second chip to the first metal studs; and
forming a second insulating layer over the second surface of the conductive substrate, the second chip, and the connections between the second chip and the first metal studs, leaving one end of each of the second metal studs exposed for external connection.

10. The method of claim 9, further comprising:
forming a plated layer on the first metal stud regions and the second metal stud regions.

11. The method of claim 9, wherein the first insulating layer is formed of a liquid compound.

12. The method of claim 9, wherein a process of forming the second insulating layer is achieved by a screen printing method.

13. The method of claim 9, wherein a process of forming the second insulating layer is achieved by a molding method.

14. The method of claim 9, wherein the first chip includes an active surface and a back surface, with the active surface having a plurality of bonding pads and the back surface attached to the die pad region, and wherein a plurality of bonding wires is employed to connect the bonding pads and the first metal stud regions.

15. The method of claim 9, wherein the second chip includes an active surface and a back surface, with the active surface having a plurality of bonding pads and the back surface attached to the die pad, and wherein a plurality of bonding wires is employed to connect the bonding pads and the first metal studs.

16. The method of claim 9, wherein defining the die pad region, a first metal stud region and a second metal stud region is achieved by half etching the conductive substrate to remove portions of the conductive substrate along the first surface uncovered by the mask layer until a predetermined thickness.

17. The method of claim 9, wherein the conductive traces have the same thickness or different thickness from the first metal studs.

18. The method of claim 9, further comprising the step of placing a plurality of solder balls on the exposed ends of the second metal studs.

19. A dual-chip package, comprising:
   a die pad having a first surface and a second surface;
   a first chip located on the first surface of the die pad;
   a second chip located on the second surface of the die pad;
   a plurality of first metal studs located around the die pad;
   a plurality of second metal studs spaced from and around the first metal studs;
   a plurality of conductive traces electrically connecting the first metal studs and the second metal studs;
   an insulating material sealing the first chip, the second chip, the connections between the chips and the metal studs, the conductive traces, the first metal studs, and one end of each second metal stud; and
   a plurality of solder balls located respectively to the top ends of the second metal studs.

20. The package of claim 19, wherein the die pad is located substantially the same level as the conductive traces.

21. The package of claim 19, wherein the first and second metal studs further have plated layers on their ends.

* * * * *